(12) United States Patent
Singh

(10) Patent No.: US 10,128,835 B2
(45) Date of Patent: Nov. 13, 2018

(54) AGING TOLERANT I/O DRIVER

(71) Applicant: STMicroelectronics International N.V., Schiphol (NL)

(72) Inventor: Prashant Singh, Greater Noida (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

(21) Appl. No.: 15/437,286

(22) Filed: Feb. 20, 2017

(65) Prior Publication Data

US 2018/0241392 A1   Aug. 23, 2018

(51) Int. Cl.
H03K 17/687 (2006.01)

(52) U.S. Cl.
CPC ................ H03K 17/6872 (2013.01)

(58) Field of Classification Search
CPC ... H03K 17/6872; H03K 19/094; H02M 1/32; H02M 1/36; H03B 1/00
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 6,680,629 B2 | 1/2004 | Rankin et al. | |
| 7,944,250 B2 * | 5/2011 | Jansen | H02M 7/538 327/108 |
| 8,649,228 B2 * | 2/2014 | Koo | G11C 7/1057 365/189.05 |
| 9,246,436 B2 * | 1/2016 | Lemkin | H03D 7/1441 |
| 9,515,555 B2 * | 12/2016 | Farrenkopf | H02M 3/1582 |
| 9,793,892 B2 * | 10/2017 | Wu | H03K 17/6872 |
| 2004/0027161 A1 | 2/2004 | Oertle et al. | |
| 2007/0052445 A1 * | 3/2007 | Wu | H03K 3/356 326/81 |
| 2012/0170385 A1 * | 7/2012 | Koo | G11C 7/1057 365/189.05 |
| 2013/0141140 A1 * | 6/2013 | Kumar | G11C 7/1057 327/108 |
| 2014/0266134 A1 * | 9/2014 | Zhak | H02M 1/36 323/311 |

(Continued)

OTHER PUBLICATIONS

Annema, Anne-Johan, et al.: "5.5-V I/O in a 2.5-V 0.25-μm CMOS Technology," IEEE Journal of Solid-State Circuits, vol. 36, No. 3, Mar. 2001, pp. 528-538.

(Continued)

*Primary Examiner* — Brandon S Cole
(74) *Attorney, Agent, or Firm* — Crowe & Dunlevy

(57) ABSTRACT

An integrated circuit includes an IO node, and an IO driver coupled thereto. The IO driver has a first driving circuit with a first PMOS transistor having a source coupled to a supply node and a gate coupled to receive a PMOS driving signal, and a first NMOS transistor having a source coupled to ground, a drain coupled to the drain of the first PMOS transistor, and a gate coupled to receive a NMOS driving signal. The IO driver also has a second driving circuit with a second PMOS transistor having a source coupled to the supply node and a gate coupled to receive a first delayed version of the PMOS driving signal, and a second NMOS transistor having a drain coupled to the drain of the second PMOS transistor, a source coupled to ground, and a gate coupled to receive a first delayed version of the NMOS driving signal.

28 Claims, 2 Drawing Sheets

(56) References Cited

U.S. PATENT DOCUMENTS

| | | | |
|---|---|---|---|
| 2015/0207401 A1* | 7/2015 | Zhang | H02M 3/158 323/271 |
| 2016/0094217 A1* | 3/2016 | Garg | H03K 17/687 327/108 |
| 2016/0173066 A1* | 6/2016 | Yang | H03K 19/0013 327/109 |
| 2016/0315539 A1* | 10/2016 | Lee | H02M 3/158 |
| 2017/0019133 A1* | 1/2017 | Gwon | H02M 3/158 |
| 2017/0170722 A1* | 6/2017 | Jung | H02M 3/07 |
| 2017/0250607 A1* | 8/2017 | Zhak | H02M 3/158 |
| 2017/0272060 A1* | 9/2017 | Murata | H03K 3/012 |

OTHER PUBLICATIONS

Annema, Anne-Johan, et al: "5.5V Tolerant I/O in a 2.5V 0.25 μm CMOS Technology," IEEE 2000 Custom Integrated Circuits conference, pp. 417-420.

Chen, Shih-Lun, et al: "A New Output Buffer for 3.3-V PCI-X Application in a 0.13-μm 1/2.5-V CMOS Process," 2004 IEEE Asia Pacific Conference on Advanced System Integrated Circuits (AP-ASIC2004)/ Aug. 4-5, 2004, pp. 112-115.

Chen, Shih-Lun, et al: "An Output Buffer for 3.3-V Applications in a 0.13-μm 1/2.5-V CMOS Process," IEEE Transactions on Circuits and Systems—II: Express Briefs, vol. 54, No. 1, Jan. 2007, pp. 14-18.

Ker, Ming-Dou, et al: "ESD Protection Design for Mixed-Voltage I/O Interfaces—Overview," 2005 IEEE, pp. 493-498.

Ker, Ming-Dou, et al: "Overview and Design of Mixed-Voltage I/O Buffers with Low-Voltage Thin-Oxide CMOS Transistors," IEEE Transactions on Circuits and Systems—I: Regular Papers, vol. 53, No. 9, Sep. 2006, pp. 1934-1945.

Ker, Ming-Dou, et al: "Overview on Electrostatic Discharge Protection Designs for Mixed-Voltage I/O Interfaces: Design Concept and Circuit Implementations," IEEE Transactions on Circuits and Systems—I: Regular Papers, vol. 53, No. 2, Feb. 2006, pp. 235-246.

Kim, Kyung Ki, et al: "On-Chip Aging Sensor Circuits for Reliable Nanometer MOSFET Digital Circuits," IEEE Transactions on Circuits and Systems, II: Express Briefs, vol. 57, No. 10, Oct. 2010, pp. 798-802.

Kumar, Sanjay V., et al: "Adaptive Techniques for Overcoming Performance Degradation Due to Aging in CMOS Circuits," IEEE Transactions on Very Large Scale Integration (VLSI) Systems, vol. 19, No. 4, Apr. 2011, pp. 603-614.

Kumar, Sanjay V., et al: "Adaptive Techniques for Overcoming Performance Degradation due to Aging in Digital Circuits," 2009 IEEE, pp. 284-289.

Kumar, Vinod: "On-Chip Aging Compensation for Output Driver," 2014 IEEE International Reliability Physics Symposium, 2014, pp. CA.3.1-CA.3.5, DOI: 10.1109/IRPS.2014.6861120.

* cited by examiner

AGING TOLERANT I/O DRIVER

TECHNICAL FIELD

This disclosure relates to the field of I/O drivers for integrated circuits, and, more particularly, to an I/O driver tolerant to aging effects caused by hot carrier injection.

BACKGROUND

Advances in the semiconductor industry continue to provide smaller device geometries. As geometries have been reduced, some failure mechanisms have become more pronounced. One of the most significant contributors to device failure in sub-micron range devices is hot carrier injection (HCI). HCI is an effect where high-energy charges are injected into the gate dielectric of a FET device, and may become lodged in the dielectric. Trapped charges may accumulate over time and affect both the turn-on voltage and the drain current of transistors, and may eventually lead to degraded operation of the device over time.

Carrier injection is a function of field strength between the source and drain of a transistor. Field strength is a function of the physical distance and voltage difference between source and drain channels. The reduction in geometries of semiconductor devices has therefore been accompanied by a reduction in the operating voltage of the device. Many logic devices that operated at 5 volts a number of years ago now operate at 3.3 volts or less.

Thus, in many modern integrated circuits, the core circuitry generally operates at a lower voltage than the I/O circuits. This provides a core circuitry design that operates at higher speeds with lower power consumption. However, since the maximum operating voltage of such core circuitry designs is also lower, these devices may not be used directly with currently known I/O circuits without special design considerations. In particular, stress on the I/O circuits must be taken into consideration and accounted for, otherwise, due to degradation from HCI over time, operation of the device can be negatively impacted.

Therefore, further development in I/O circuits is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An integrated circuit includes an IO node, and an IO driver coupled thereto. The IO driver has a first driving circuit with a first PMOS transistor having a source coupled to a supply node and a gate coupled to receive a PMOS driving signal, and a first NMOS transistor having a source coupled to ground, a drain coupled to the drain of the first PMOS transistor, and a gate coupled to receive a NMOS driving signal. The IO driver also has a second driving circuit with a second PMOS transistor having a source coupled to the supply node and a gate coupled to receive a first delayed version of the PMOS driving signal, and a second NMOS transistor having a drain coupled to the drain of the second PMOS transistor, a source coupled to ground, and a gate coupled to receive a first delayed version of the NMOS driving signal.

A first capacitor may be coupled between the drain of the first PMOS transistor and the drain of the first NMOS transistor, and a second capacitor may be coupled between the drain of the second PMOS transistor and the drain of the second NMOS transistor.

The IO driver may also include a third driving circuit with a third PMOS transistor having a source coupled to a supply node, a drain, and a gate coupled to receive a second delayed version of the PMOS driving signal, and a third NMOS transistor having a drain coupled to the drain of the third PMOS transistor, a source coupled to ground, and a gate coupled to receive a second delayed version of the NMOS driving signal.

A third capacitor may be coupled between the drain of the third PMOS transistor and the drain of the third NMOS transistor.

The IO driver may also include a fourth driving circuit with a fourth PMOS transistor having a source coupled to the supply node, a drain, and a gate coupled to receive a third delayed version of the PMOS driving signal, and a fourth NMOS transistor having a drain coupled to the drain of the fourth PMOS transistor, a source coupled to ground, and a gate coupled to receive a third delayed version of the NMOS driving signal.

A fourth capacitor may be coupled between the drain of the fourth PMOS transistor and the drain of the fourth NMOS transistor.

A pre-driver circuit may be configured to generate the PMOS driving signal and the NMOS driving signal.

A level shifter may be configured to receive a data signal and configured to output a level shifted data signal; and wherein the pre-driver circuit generates the PMOS driving signal and NMOS driving signal as a function of the level shifted data signal.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
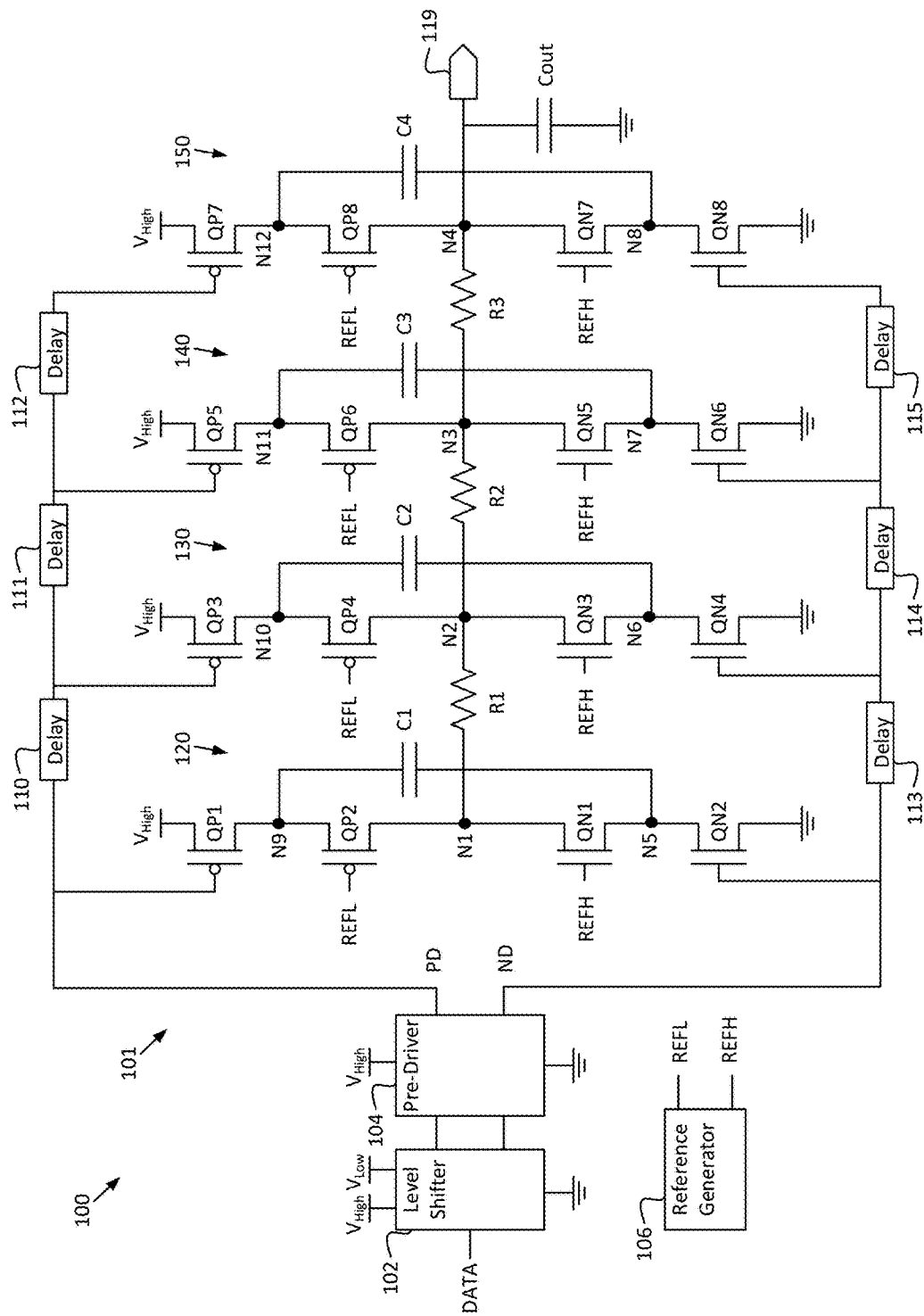
FIG. 1 is a schematic diagram of an I/O circuit, including an I/O driver, for an integrated circuit in accordance with this disclosure.

With reference to FIG. 1, an input/output (I/O) interface 100 for an integrated circuit or other device is now described. The I/O interface 100 includes a level shifter 102 receiving data, and generating control signals for a pre-driver 104. The pre-driver 104 generates a PMOS driving signal PD and a NMOS driving signal ND for the driver 101. A reference generator 106 generates a low reference voltage REFL and a high reference voltage REFH to be used by the driver 101. REFL and REFH are biased voltages for biasing the gates of cascode transistors QP2, QP4, QP6, QP8 and QN1, QN3, QN5, QN7

The driver 101 includes four cascaded driving circuits 120, 130, 140, and 150. The first driving circuit 120 is now described, and includes PMOS transistor QP1 having its source coupled to a supply voltage (such as 3.3 v), and its gate directly coupled to the PMOS driving signal PD. PMOS transistor QP2 has its source coupled to the drain of PMOS transistor QP1 at node N9, its drain coupled to central node N1, and its gate biased by the low reference voltage REFL.

NMOS transistor QN1 has its drain coupled to the central node N1 and its gate biased by the high reference voltage REFH. NMOS transistor QN2 has its drain coupled to the source of NMOS transistor QN1 at node N5, its source coupled to ground, and its gate coupled to the NMOS driving signal ND.

Capacitor C1 capacitively couples the drain of transistor QP1 to the drain of transistor QN2.

The second driving circuit 130 is now described, and includes PMOS transistor QP3 having its source coupled to the supply voltage, and its gate coupled to receive, from the delay block 110, a delayed version of the PMOS driving signal PD. PMOS transistor QP4 has its source coupled to the drain of PMOS transistor QP3 at node N10, its source coupled to central node N2, and its gate biased by the low reference voltage REFL.

NMOS transistor QN3 has its drain coupled to the central node N2, and its gate biased by the high reference voltage REFH. NMOS transistor QN4 has its drain coupled to the source of NMOS transistor QN3 at node N6, its source coupled to ground, and its gate coupled to receive, from delay block 113, a delayed version of the NMOS driving signal ND.

Capacitor C2 capacitively couples the drain of transistor QP3 to the drain of transistor QN4.

The third driving circuit 140 is now described, and includes PMOS transistor QP5 having its source coupled to the supply voltage, and its gate coupled to receive, from the delay block 111, a further delayed version of the PMOS driving signal PD. PMOS transistor QP6 has its source coupled to the drain of PMOS transistor QP5 at node N11, its source coupled to central node N3, and its gate coupled biased by the low reference voltage REFL.

NMOS transistor QN5 has its drain coupled to the central node N3, and its gate biased by the high reference voltage REFH. NMOS transistor QN6 has its drain coupled to the source of NMOS transistor QN5 at node N7, its source coupled to ground, and its gate coupled to receive, from delay block 114, a further delayed version of the NMOS driving signal ND.

Capacitor C3 capacitively couples the drain of transistor QP5 to the drain of transistor QN6.

The fourth driving circuit 150 is now described, and includes PMOS transistor QP7 having its source coupled to the supply voltage, and its gate coupled to receive, from the delay block 112, a still further delayed version of the PMOS driving signal PD. PMOS transistor QP8 has its source coupled to the drain of PMOS transistor QP7, its source coupled to central node N4, and its gate biased by the low reference voltage REFL.

NMOS transistor QN7 has its drain coupled to the central node N3, and its gate coupled to the high reference voltage REFH. NMOS transistor QN8 has its drain coupled to the source of NMOS transistor QN7 at node N8, its source coupled to ground, and its gate coupled to receive, from delay block 115, a still further delayed version of the NMOS driving signal ND.

Capacitor C4 capacitively couples the drain of transistor QP7 to the drain of transistor QN8.

Resistor R1 couples central node N1 to central node N2. Resistor R2 couples central node N2 to central node N3. Resistor R3 couples central node N3 to central node N4. Central node N4 in turn is coupled to the I/O pad 119. An output capacitor Cout is coupled between the I/O pad 119 and ground.

In some cases, the level shifter 102 and pre-driver 104 functions may be performed by one circuit, rather than two separate circuits. In addition, if the level shifter 102 has sufficient drive capacity to drive the gates of transistors in the driver 101, the pre-driver 104 may be omitted.

In operation, the pre-driver 104 generates the PMOS driving signal PD and the NMOS driving signal ND based upon the data. These signals serve to switch on either PMOS transistor QP1 or NMOS transistor QN2, so as to produce a logic high or a logic low at the central node N1. The first delayed version of these signals (with a delay of 5 ns, for example) produced by delay blocks 110 and 113 serve to switch on either PMOS transistor QP3 or NMOS transistor QN4, so as to produce a logic high or a logic low at the central node N2. Similarly, the second delayed version of these signals (with a total delay of 10 ns, for example) produced by delay blocks 111 and 114 serve to switch on either PMOS transistor QP5 or NMOS transistor QN6, so as to produce a logic high or a logic low at the central node N3. Likewise, the third delayed version of these signals (with a total delay of 15 ns, for example) produced by delay blocks 112 and 115 serve to switch on either PMOS transistor QP7 or NMOS transistor QN8, so as to produce a logic high or a logic low at the central node N4.

Figure 2A:
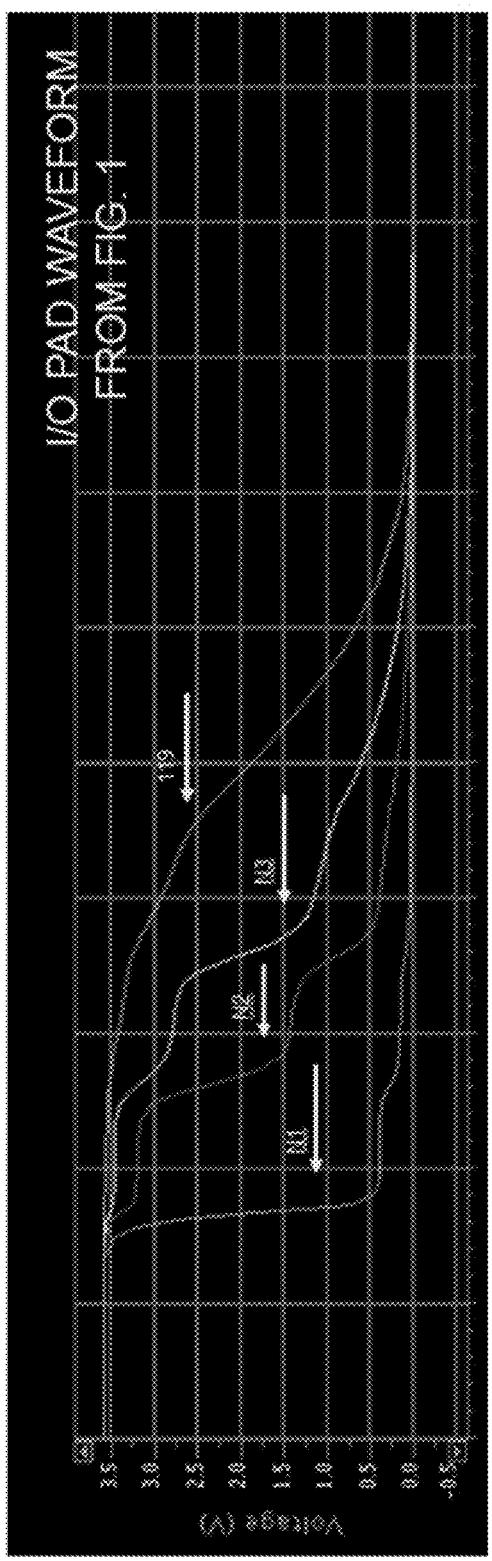
FIG. 2A is a graph of output voltages of the I/O circuit at the I/O pad.
Figure 2B:
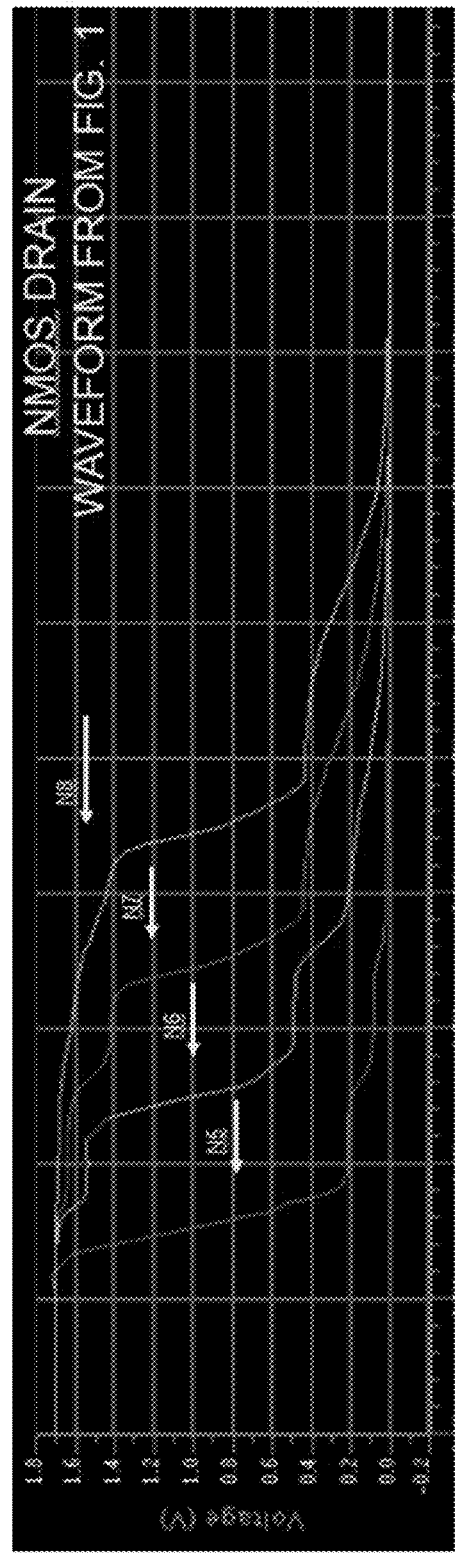
FIG. 2B is a graph of drain voltages of NMOS transistors of the I/O driver of the I/O circuit.

As can be seen in FIG. 2A, through the use of the consecutively delayed PMOS and NMOS driving signal PD and ND, the voltage at the pad 119 during transition is a combination of the voltages at central nodes N1, N2, N3, and N4 has a smooth and consistent fall time. The corresponding fall times of the voltage at nodes N5, N6, N7, and N8 can be seen in FIG. 2B.

In a transient condition, the potential difference between node N1 and N5 does not exceed the breakdown voltage of NMOS transistor QN1. This is done through the coupling capacitance C1 and the delay mechanism so that voltage at node N1 and N5 fall at the same rate. This same functionality and mechanism also applies to NMOS transistors QN3, QN5 and QN7. Therefor each NMOS transistor has a minimum potential difference (which is less than the electrical overstress or breakdown voltage) between its drain and source in a transient fall time condition which helps to further reduce HCI effects considerably.

Through the use of the cascaded driving circuit 120, 130, 140, and 1150, the fall time of the voltage at the pad 119 during transitions from a logic high to a logic low remains relatively consistent over age. Here, impact of HCI on the fall time of the I/O circuit 100 of this disclosure is reduced by 70% compared to the fall time of prior art I/O drivers.

This renders the I/O circuit 100 quite suitable for harsh environments in which the effects of aging are particularly deleterious, as repair and replacement of devices is difficult or impossible. For example, the I/O circuit 100 is particularly suitable for use in satellites, space probes, and space craft. The I/O circuit 100 is also suitable for a variety of other applications requiring long life, such as set top boxes, networking devices, gaming devices, and servers.

The various transistors used in this I/O driver 100 may have a thickness of 28A° and may have a maximum tolerance voltage of 1.8V. The I/O supply voltage may be higher than 1.8V. This I/O Driver 100, as explained, is tolerant to electrical overstress from high I/O supply voltages and a high HCI impact caused by a high potential difference drain between and source of NMOS transistors during transients. The HCI impact is reduced by the unique delay mechanism and the coupling capacitance effects. As explained, the impact of HCI on the I/O driver 100 is reduced by 70% compared to prior I/O drivers.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An integrated circuit, comprising:
an IO node;
an IO driver coupled to the IO node, the IO driver comprising:
    a first driving circuit comprising:
        a first PMOS transistor having a source coupled to a supply node, a drain, and a gate coupled to receive a PMOS driving signal;
        a first NMOS transistor having a source coupled to ground, a drain coupled to the drain of the first PMOS transistor, and a gate coupled to receive a NMOS driving signal; and
        a first capacitor having a first terminal directly coupled to the drain of the first PMOS transistor and a second terminal directly coupled to the drain of the first NMOS transistor; and
    a second driving circuit comprising:
        a second PMOS transistor having a source coupled to the supply node, a drain, and a gate coupled to receive a first delayed version of the PMOS driving signal;
        a second NMOS transistor having a drain coupled to the drain of the second PMOS transistor, a source coupled to ground, and a gate coupled to receive a first delayed version of the NMOS driving signal; and
        a second capacitor having a first terminal directly coupled to the drain of the second PMOS transistor and a second terminal directly coupled to the drain of the second NMOS transistor.

2. The integrated circuit of claim 1, wherein the IO driver further comprises:
a third driving circuit comprising:
a third PMOS transistor having a source coupled to a supply node, a drain, and a gate coupled to receive a second delayed version of the PMOS driving signal; and
a third NMOS transistor having a drain coupled to the drain of the third PMOS transistor, a source coupled to ground, and a gate coupled to receive a second delayed version of the NMOS driving signal.

3. The integrated circuit of claim 2, further comprising a third capacitor directly coupled to the drain of the third PMOS transistor and the drain of the third NMOS transistor.

4. The integrated circuit of claim 2, wherein the IO driver further comprises:
a fourth driving circuit comprising:
a fourth PMOS transistor having a source coupled to the supply node, a drain, and a gate coupled to receive a third delayed version of the PMOS driving signal;
a fourth NMOS transistor having a drain coupled to the drain of the fourth PMOS transistor, a source coupled to ground, and a gate coupled to receive a third delayed version of the NMOS driving signal.

5. The integrated circuit of claim 4, further comprising a fourth capacitor directly coupled to the drain of the fourth PMOS transistor and the drain of the fourth NMOS transistor.

6. The integrated circuit of claim 1, further comprising a pre-driver circuit configured to generate the PMOS driving signal and the NMOS driving signal.

7. The integrated circuit of claim 6, further comprising a level shifter configured to receive a data signal and configured to output a level shifted data signal; and wherein the pre-driver circuit generates the PMOS driving signal and NMOS driving signal as a function of the level shifted data signal.

8. The integrated circuit of claim 1, wherein the first terminal of the first capacitor is directly electrically coupled to the drain of the first PMOS transistor; wherein the second terminal of the first capacitor is directly electrically coupled to the drain of the first NMOS transistor; wherein the first terminal of the second capacitor is directly electrically coupled to the drain of the second PMOS transistor; and wherein the second terminal of the second capacitor is directly electrically coupled to the drain of the second NMOS transistor.

9. An integrated circuit, comprising:
an IO node;
an IO driver coupled to the IO node, the IO driver comprising:
    a first driving circuit comprising:
        a first PMOS transistor having a source coupled to a supply node, a drain, and a gate coupled to receive a PMOS driving signal;
        a second PMOS transistor having a source coupled to the drain of the first PMOS transistor, a drain coupled to a first central node, and a gate coupled to a low reference voltage;
        a first NMOS transistor having a drain coupled to the first central node, a source, and a gate coupled to a high reference voltage;
        a second NMOS transistor having a drain coupled to the source of the first NMOS transistor, a source coupled to ground, and a gate coupled to receive a NMOS driving signal; and
        a first capacitor directly coupled to the source of the second PMOS transistor and the drain of the second NMOS transistor; and
    a second driving circuit comprising:
        a third PMOS transistor having a source coupled to the supply node, a drain, and a gate coupled to receive a first delayed version of the PMOS driving signal;
        a fourth PMOS transistor having a source coupled to the drain of the third PMOS transistor, a drain coupled to a second central node, and a gate coupled to the low reference voltage;
        a third NMOS transistor having a drain coupled to the second central node, a source, and a gate coupled to the high reference voltage;
        a fourth NMOS transistor having a drain coupled to the source of the third NMOS transistor, a source coupled to ground, and a gate coupled to receive a first delayed version of the NMOS driving signal; and
        a second capacitor directly coupled to the source of the fourth PMOS transistor and the drain of the fourth NMOS transistor;

wherein the IO node is coupled to the IO driver via the first central node and the second central node.

10. The integrated circuit of claim 9, wherein the first and second central nodes are resistively coupled.

11. The integrated circuit of claim 9, further comprising an IO capacitance coupled between the IO node and ground.

12. The integrated circuit of claim 9, wherein the IO driver further comprises:
a third driving circuit comprising:
a fifth PMOS transistor having a source coupled to a supply node, a drain, and a gate coupled to receive a second delayed version of the PMOS driving signal;
a sixth PMOS transistor having a source coupled to the drain of the fifth PMOS transistor, a drain coupled to a third central node, and a gate coupled to a low reference voltage;
a fifth NMOS transistor having a drain coupled to the third central node, a source, and a gate coupled to the high reference voltage;
a sixth NMOS transistor having a drain coupled to the source of the fifth NMOS transistor, a source coupled to ground, and a gate coupled to receive a second delayed version of the NMOS driving signal;
wherein the TO node is coupled to the TO driver via the first central node, the second central node, and the third central node.

13. The integrated circuit of claim 12, wherein the first, second, and third central nodes are resistively coupled.

14. The integrated circuit of claim 12, further comprising a third capacitor directly coupled to the source of the sixth PMOS transistor and the drain of the sixth NMOS transistor.

15. The integrated circuit of claim 12, wherein the TO driver further comprises:
a fourth driving circuit comprising:
a seventh PMOS transistor having a source coupled to the supply node, a drain, and a gate coupled to receive a third delayed version of the PMOS driving signal;
an eighth PMOS transistor having a source coupled to the drain of the seventh PMOS transistor, a drain coupled to a fourth central node, and a gate coupled to the low reference voltage;
a seventh NMOS transistor having a drain coupled to the fourth central node, a source, and a gate coupled to the high reference voltage;
an eighth NMOS transistor having a drain coupled to the source of the seventh NMOS transistor, a source coupled to ground, and a gate coupled to receive a third delayed version of the NMOS driving signal;
wherein the TO node is coupled to the TO driver via the first central node, the second central node, the third central node, and the fourth central node.

16. The integrated circuit of claim 15, wherein the first, second, third, and fourth central nodes are resistively coupled.

17. The integrated circuit of claim 15, further comprising a fourth capacitor directly coupled to the source of the eighth PMOS transistor and the drain of the eighth PMOS transistor.

18. The integrated circuit of claim 9, further comprising a pre-driver circuit configured to generate the PMOS driving signal and the NMOS driving signal.

19. The integrated circuit of claim 18, further comprising a level shifter configured to receive a data signal and configured to output a level shifted data signal; and wherein the pre-driver circuit generates the PMOS driving signal and NMOS driving signal as a function of the level shifted data signal.

20. The integrated circuit of claim 9, wherein the first capacitor is directly electrically coupled to the source of the second PMOS transistor and the drain of the second NMOS transistor; and wherein the second capacitor is directly electrically coupled to the source of the fourth PMOS transistor and the drain of the fourth NMOS transistor.

21. An electronic device, comprising:
an TO pin;
an TO driver coupled to the TO pin, the TO driver comprising:
a first driving circuit comprising:
a first PMOS driving circuit operating under control of a PMOS driving signal, the first PMOS driving circuit having:
a first conduction terminal coupled to a supply node,
a center tap, and
a second conduction terminal;
a first NMOS driving circuit coupled in series with the first PMOS driving circuit at a first central node to which the second conduction terminal of the first PMOS driving circuit is coupled and operating under control of an NMOS driving signal, the first NMOS driving circuit having:
a first conduction terminal coupled to the first central node,
a center tap, and
a second conduction terminal coupled to ground; and
a first capacitor having a first terminal directly coupled to the center tap of the first PMOS driving circuit and a second terminal directly coupled to the center tap of the first NMOS driving circuit; and
a second driving circuit comprising:
a second PMOS driving circuit operating under control of a first delayed version of the PMOS driving signal, the second PMOS driving circuit having:
a first conduction terminal coupled to the supply node,
a center tap, and
a second conduction terminal;
a second NMOS driving circuit coupled in series with the second PMOS driving circuit at a second central node to which the second conduction terminal of the second PMOS driving circuit is coupled and operating under control of a first delayed version of the NMOS driving signal, the second NMOS driving circuit having:
a first conduction terminal coupled to the second central node,
a center tap, and
a second conduction terminal coupled to ground; and
a second capacitor having a first terminal directly coupled to the center tap of the second PMOS driving circuit and a second terminal directly coupled to the center tap of the second NMOS driving circuit;
wherein the first and second central nodes are resistively coupled.

22. The electronic device of claim 21, wherein the IO driver further comprises:
a third driving circuit comprising:

a third PMOS driving circuit operating under control of a second delayed version of the PMOS driving signal, the third PMOS driving circuit having:
a first conduction terminal coupled to the supply node,
a center tap, and
a second conduction terminal;
a third NMOS driving circuit coupled in series with the third PMOS driving circuit at a third central node to which the second conduction terminal of the third PMOS driving circuit is coupled and operating under control of a second delayed version of the NMOS driving signal, the third NMOS driving circuit having:
a first conduction terminal coupled to the third central node,
a center tap, and
a second conduction terminal coupled to ground;
wherein the first, second, and third central nodes are resistively coupled.

23. The electronic device of claim 22, wherein the TO driver further comprises:
a fourth driving circuit comprising:
a fourth PMOS driving circuit operating under control of a third delayed version of the PMOS driving signal, the fourth PMOS driving circuit having:
a first conduction terminal coupled to the supply node,
a center tap, and
a second conduction terminal;
a fourth NMOS driving circuit coupled in series with the fourth PMOS driving circuit at a fourth central node to which the second conduction terminal of the fourth PMOS driving circuit is coupled and operating under control of a third delayed version of the NMOS driving signal, the fourth NMOS driving circuit having:
a first conduction terminal coupled to the fourth central node,
a center tap, and
a second conduction terminal coupled to ground;
wherein the first, second, third, and fourth central nodes are resistively coupled.

24. The electronic device of claim 23, further comprising a third capacitor having a first terminal directly coupled to the center tap of the third PMOS driving circuit and a second terminal directly coupled to the center tap of the third NMOS driving circuit, and a fourth capacitor having a first terminal directly coupled to the center tap of the fourth PMOS driving circuit and a second terminal directly coupled to the center tap of the fourth NMOS driving circuit.

25. The electronic device of claim 21, further comprising an IO capacitor directly coupled to the IO pin and ground.

26. The electronic device of claim 21, further comprising a pre-driver circuit configured to generate the PMOS driving signal and the NMOS driving signal.

27. The electronic device of claim 26, further comprising a level shifter configured to receive a data signal and configured to output a level shifted data signal; and wherein the pre-driver circuit generates the PMOS driving signal and NMOS driving signal as a function of the level shifted data signal.

28. The electronic device of claim 21, wherein the first terminal of the first capacitor is directly electrically coupled to the center tap of the first PMOS driving circuit; wherein the second terminal of the first capacitor is directly electrically coupled to the center tap of the first NMOS driving circuit; wherein the first terminal of the second capacitor is directly electrically coupled to the center tap of the second PMOS driving circuit; and wherein the second terminal of the second capacitor is directly electrically coupled to the center tap of the second NMOS driving circuit.

* * * * *

UNITED STATES PATENT AND TRADEMARK OFFICE
CERTIFICATE OF CORRECTION

PATENT NO. : 10,128,835 B2
APPLICATION NO. : 15/437286
DATED : November 13, 2018
INVENTOR(S) : Prashant Singh Page 1 of 1

It is certified that error appears in the above-identified patent and that said Letters Patent is hereby corrected as shown below:

In the Claims

At Column 8, Claim number 21, Line 8, please replace [[ TO pin ]] with -- IO pin --.

At Column 8, Claim number 21, Line 9, please replace [[ an TO driver coupled to the TO pin, the TO driver ]] with -- an IO driver coupled to the IO pin, the IO driver --.

At Column 9, Claim number 23, Line 21, please replace [[ the TO ]] with -- the IO --.

Signed and Sealed this
Sixteenth Day of April, 2019

Andrei Iancu
*Director of the United States Patent and Trademark Office*